US008055459B2

(12) United States Patent
Montanari et al.

(10) Patent No.: US 8,055,459 B2
(45) Date of Patent: Nov. 8, 2011

(54) INSTRUMENT AND METHOD FOR MEASURING PARTIAL ELECTRICAL DISCHARGES IN AN ELECTRICAL SYSTEM

(75) Inventors: Gian Carlo Montanari, Casalecchio Di Reno (IT); Gaetano Pasini, Marano Sul Panaro (IT); Fabiano Bettio, Monte San Pietro (IT); Andrea Cavallini, San Pietro In Casale (IT); Francesco Puletti, Citta' Di Castello (IT); Dario Andreani, Bologna (IT)

(73) Assignee: Techimp Technologies S.R.L., Bologna (IT)

( * ) Notice: Subject to any disclaimer, the term of this patent is extended or adjusted under 35 U.S.C. 154(b) by 396 days.

(21) Appl. No.: 12/304,410

(22) PCT Filed: Apr. 11, 2007

(86) PCT No.: PCT/IB2007/051293
§ 371 (c)(1),
(2), (4) Date: Dec. 11, 2008

(87) PCT Pub. No.: WO2007/144789
PCT Pub. Date: Dec. 21, 2007

(65) Prior Publication Data
US 2009/0248327 A1    Oct. 1, 2009

(30) Foreign Application Priority Data
Jun. 13, 2006   (IT) .............................. PR2006A0054

(51) Int. Cl.
*G01R 29/00* (2006.01)
*G01R 31/00* (2006.01)
*G06F 19/00* (2011.01)
*G06F 17/40* (2006.01)

(52) U.S. Cl. ..... 702/58; 73/865.9; 73/866.3; 324/76.38; 324/538; 324/543; 324/551; 340/635; 340/647; 340/659; 702/182; 702/187; 702/189

(58) Field of Classification Search ................. 73/432.1, 73/865.8, 865.9, 866.3; 324/76.11, 76.12, 324/76.38, 500, 537, 538, 543, 544, 551, 324/555, 557; 327/100, 524, 551; 340/500, 340/540, 635, 638, 644, 647, 657, 659, 870.01, 340/870.07, 870.16; 702/1, 33, 34, 57, 58, 702/60, 64, 65, 66, 69, 70, 127, 182, 187, 702/189, 190; 708/100, 105, 131, 160, 200
See application file for complete search history.

(56) References Cited

U.S. PATENT DOCUMENTS
3,403,227 A * 9/1968 Malm ........................... 704/225
(Continued)

FOREIGN PATENT DOCUMENTS
WO    2005/038475 A1    4/2005
(Continued)

OTHER PUBLICATIONS
Chinese Office action dated Dec. 31, 2010 in Chinese App. No. 20078002209809, 27 pages, which includes Chinese versions of D1 and D2 (with English Abstract).
(Continued)

*Primary Examiner* — Edward Cosimano
(74) *Attorney, Agent, or Firm* — Pearne & Gordon LLP

(57) ABSTRACT

An instrument (1) and a method for measuring pulses of partial electrical discharges in an electrical system comprise data processing means (5) operatively associated both with an input stage (2), able to receive an analogue signal (3) representing said pulses and to provide a digital representation of the entire wave form of the pulses, to receive said digital representation, extract the value of predetermined parameters relating to the wave form of the pulses and transfer to and output stage (4) a processed digital signal comprising said values, the processing means (5) being able to operate substantially in real time, i.e. with no need for a memory for the intermediate storage of the data. Known solutions within the field of the measurement of partial discharge pulses for diagnostic purposes provide for the use of peak detector instruments, which are not able to measure all information useful for a diagnosis of the electrical system, and oscilloscopes interacting with a computer, disadvantageous in terms of costs and of calculation efficiency.

18 Claims, 3 Drawing Sheets

U.S. PATENT DOCUMENTS

| | | | | |
|---|---|---|---|---|
| 3,538,505 | A | * | 11/1970 | Schumann ............... 702/66 |
| 4,020,286 | A | * | 4/1977 | Ceci ......................... 704/226 |
| 5,107,447 | A | | 4/1992 | Ozawa et al. |
| 5,136,652 | A | * | 8/1992 | Jibbe et al. ............... 704/212 |
| 5,200,737 | A | * | 4/1993 | Konishi et al. ........... 340/644 |
| 5,828,227 | A | * | 10/1998 | Shiota et al. ............. 324/765.01 |
| 6,114,871 | A | * | 9/2000 | Shiota et al. ............. 324/765.01 |
| 6,242,922 | B1 | * | 6/2001 | Daum et al. .............. 324/520 |
| 6,313,640 | B1 | | 11/2001 | Nasrallah et al. |
| 7,285,961 | B2 | | 10/2007 | Shinmoto et al. |
| 2001/0040459 | A1 | | 11/2001 | Kato et al. |
| 2007/0085548 | A1 | | 4/2007 | Shinmoto et al. |
| 2010/0191486 | A1 | * | 7/2010 | Montanari et al. ........ 702/58 |

FOREIGN PATENT DOCUMENTS

| | | | |
|---|---|---|---|
| WO | WO 2007/144789 | A2 * | 12/2007 |
| WO | WO 2009/013640 | A1 * | 1/2009 |

OTHER PUBLICATIONS

Borghetto Johnny et al., "Partial Discharge Inference by an Advanced System. Analysis of Online Measurements Performed on Hydrogenerator", IEEE Transactions on Energy Conversion, vol. 19, No. 2, Jun. 2004, pp. 333-339.

Yang Hemin et al., "Diagnosis and Analyzing System for Stator Insulation of Large-Size Hydro-Generators Based on Partial Discharge", Automation of Electric Power Systems, Col. 28, Issue 15, pp. 61-66, Aug. 10, 2004., 16 pages.

Hoshino Toshihiro et al., "Real-time PD identification in Diagnosis of GIS Using Symmetric and Asymmetric UHF Sensors", IEEE/PES Transmission and Distribution Conference and Exhibition 2002 : Asia Pacific, Yokohama, Japan, Oct. 6-10, 2002, IEEE/PES Transmission and Distribution Conference and Exhibition, New York, NY : IEEE, US, vol. vol. 1 F 3, Oct. 6, 2002, pp. 798-801, XP010630413 ISBN: 0-7803-7525-4.

* cited by examiner

INSTRUMENT AND METHOD FOR MEASURING PARTIAL ELECTRICAL DISCHARGES IN AN ELECTRICAL SYSTEM

TECHNICAL FIELD AND BACKGROUND ART

The present invention relates to an instrument and a method for measuring partial electrical discharges in an electrical system, the instrument comprising:

an input stage set up to receive an analogue signal representing one or more pulses of partial discharges to be measured and to generate at its output a digital representation of the entire wave form of said one or more pulses, an output stage set up to transfer data in digital shape at the output from the instrument.

The technical sector of the present invention is that of the diagnostics of electrical systems (in particular in high voltage), by the measurement/processing of partial electrical discharges and possibly other quantities.

It should be noted that a partial discharge is an electrical discharge that involves a limited portion of an insulator of an electrical system, therefore it does not cause the immediate failure of the system, but its progressive degradation. Thus, partial discharges have, for their nature, a development that is substantially limited to a defect of the insulating system. In this light, diagnostic techniques based on the measurement and interpretation of partial discharges are among the most promising and they are widely studied in scientific research, because the study of partial discharges allows to investigate the nature of the defects of the insulating system in which the discharges themselves reside.

However, the measurement together with the subsequent evaluation of partial discharges for diagnostic purposes has not yet completely been included among industrial standards, as an instrument to plan the maintenance and/or replacement of electrical components operating at high voltage, because of the difficulty that is encountered in interpreting the results of the measurements.

With regard to the measurement of partial discharges, various types of techniques have been developed, exploiting the different physical phenomena associated to the arrival of the discharges, such as optical, acoustic and electrical techniques. The present invention relates, in particular but not exclusively, to electrical measuring techniques, which consist, as is well known, of measuring the current pulses that travel through a measuring circuit coupled with the electrical system in question. Said measured current pulses (hereafter called discharge pulses, for the sake of simplicity), have a time development, which depends on the dynamics with which the partial discharges occur (i.e. on the physics of the discharge phenomena) and on the nature of the means that the measured pulses traverse, in their path from the discharge site (in which the discharges originate) to the measurement site. Thus, the time development of the discharge pulses, consisting of the wave form of the pulses themselves, comprises information that is precious from the diagnostic viewpoint, both with regard to the physical phenomena associated with the discharges (correlated to the nature of the defects of the insulating system), and the nature of the medium which the measured pulses traverse (correlated to the location of the defects within the insulating system).

With regard to the difficulties in the interpretation of the results of the measurements of partial discharges, they depend not only on the need to have available a specific experience and case record, but also on the fact that the measured data could be unreliable or not significant.

In this light, the problems that can compromise diagnostics through the evaluation of the measurements of partial discharges are essentially two:

in the measurement of the signals associated with the partial discharges, there is a loss of information that is essential for a subsequent evaluation of the signals for diagnostic purposes (a loss of information can be constituted, for example, by a failure to measure an impulse, or by a failure to measure the wave form of a pulse);

during said measurement, noise may be superposed to the discharge signals, or signals due to different sources may be mutually superposed, with a consequent objective difficulty in interpreting the results, given the impossibility to perform significant statistical processing on heterogeneous data and/or on data that are not pertinent to the individual phenomena to be evaluated.

With regard to said loss of information while performing the measurement, it should be noted that the signals associated to the partial discharges are electrical impulses having a very high frequency content (they have up-ramps in the order of nanoseconds, or tens of nanoseconds) and, in certain cases, their repetition rate is quite high (e.g., hundreds of thousands of pulses per second).

Therefore, from the viewpoint of the instrument used to measure the signals associated with partial discharges, there is the problem of acquiring, very rapidly and efficiently, electrical signals having a high frequency content, preserving, as much as possible, the information content of the signals themselves. Moreover, said instrument should allow an effective separation of signals that are significant for the diagnosis from noise or from other "unwanted" signals.

The solution of the aforementioned problems is particularly difficult, considering the need to measure the partial discharges and to evaluate the state of the electrical system in unsupervised fashion, i.e. minimising the intervention of an operator (the operator, in certain cases, could be absent altogether, as is the case in line monitoring systems).

With regard to the state of the art in the sector instruments for measuring partial discharges (PD), the following is a list of known instruments, which can be subdivided in two categories: peak detectors (typically, narrow/selective band instruments) and software-controlled oscilloscopes (typically, wide band instruments). The main difference between peak detectors and controlled oscilloscopes is that peak detectors are not able to record the time dynamics of the detected pulse, because they do not perform an actual sampling of the signal, unlike oscilloscopes, which instead do perform said sampling. In this light, it should be noted that peak detectors are generally provided with a relatively narrow/selective band in order to be robust with respect to unwanted signals, in particular background noise.

Peak detectors are instruments that provide indications solely about the phase of occurrence and the amplitude of PD The amplitude of a PD is generally obtained passing the analogue signal through an FQI (quasi-integrator filter) and, hence, measuring the peak value. Within the field of peak detectors, the following types of instruments can be further distinguished:

Fully analogue instruments. The FQI is constituted by an analogue electrical grid. The output signal from the FQI is displayed on an oscilloscope. The available information is the known Lissajous figure, made available by the oscilloscope.

Mixed analogue/digital instruments. The FQI is still obtained by means of an analogue electrical grid and sent to a peak detector, also analogue, which provides the amplitude of the PD. The electronics of the instrument converts the amplitude signal of the PD (output by the peak detector) from analogue to digital. The available information is the set of the possible representations that can be obtained knowing phase and amplitude of the PDs, e.g., the known phase/amplitude pattern.

Fully digital instruments. The signal is filtered for the purpose of avoiding the known phenomenon of aliasing and, subsequently, it is sampled (analogue/digital transformation). The chain for calculating the amplitude of the PD (FQI filtering and detection of the peak of the signal output by the FQI) is obtained in this instruments by means of numeric algorithms. As in the previous case, the available information is the set of the possible representations that can be obtained knowing phase and amplitude of the PDs. It should be noted that said quasi-integrator filter FQI returns a signal whose information content (useful for a subsequent diagnosis of the electrical system to be evaluated) consists solely of a peak value of the wave form of the input signal, said value corresponding to the amplitude of the PD.

Instruments are known from WO2005/038475A and U.S. Pat. No. 5,107,447A which enable the measurement of PDs and the judgement of predetermined features of those PDs, possibly using a real-time approach.

With regard to controlled oscilloscopes (controlled so they can acquire the signal output by the analogue circuits used to capture the partial discharge signal), there are known technical solutions developed in universities, for scientific research purposes. Known instruments have the following limits and disadvantages.

Peak detectors entail a drastic loss of information in the detected signals, due to the strong compression of the information associated with the partial discharge signal, due to the fact that they do not sample the detected signal and to the presence of the quasi-integrator filter. In particular, they do not allow to acquire significant information about the wave form of the pulses of the detected partial discharges. Therefore, they do not allow to separate (especially in automatic, unsupervised fashion) the noise from the discharge signals and, to a greater extent, the discharge signals coming from different sources. Moreover, peak detectors have a limitation in the phase of attributing the sign to the measured amplitude for a pulse, said sign having considerable importance, as is well known, in interpreting the results of the measurements (which are carried out, in most applications, subjecting the electrical components in question to alternating voltage). In particular, peak detectors do not allow to verify said attribution (possibly by performing the sign attribution step again, on the basis of a different criterion/calculation algorithm). With regard to the attribution of the sign of the discharges, it should also be noted that an additional limitation is associated with the instruments that detect pulses using a narrow band; a limited bandwidth could alter the time dynamic of the pulse, especially when the pulse has very rapid changes over time.

Therefore, in order to carry out a correct evaluation of the state of the insulation, the operator has to have a considerable experience, such as to allow him/her to evaluate the different contributions, separate them and provide and indication of their dangerousness. The procedure is complex in itself and it provides a subjective evaluation of the state of the insulation. To this should be added that, in many case, the operator's experience is anyway not sufficient to compensate for the loss of information during the signal detection step.

It should also be noted that instruments are known which, in addition to the amplitude of the pulse, are able to measure the time width of the pulse itself; such instruments are substantially peak detectors provided with a plurality of comparators (with different thresholds). Therefore, said instruments carry out, in fact, a sort of sampling (in certain case, with variable frequency). However, said instruments do not allow to detect the wave form of the pulse, i.e. the profile of the pulse amplitude over time, said wave form instead having fundamental importance for the purposes of a subsequent diagnostic evaluation of the acquired data.

On the contrary, oscilloscopes allow to measure discharge signals in wide band, and to acquire the entire wave form of the detected pulses. However, they are definitely costly and poorly reliable, especially in on-site applications, because they are particularly exposed to failures (e.g., in the presence of overvoltages). In fact, use of oscilloscopes is quite limited as far as field applications are concerned. Moreover, they are generally not able to reject noise by means of algorithms programmable within them. They also require the presence of a software residing in a computer, hence with the need to manage a large quantity of data.

Moreover, from the viewpoint of a diagnostic evaluation of the electrical system to be assessed, it can be useful (if not indispensable) to acquire, in addition to the partial discharge signals, also other quantities, e.g. quantities correlated to environmental factors (such as temperature and humidity), to be used in synergetic fashion together with data about partial discharge activity. Typically, said quantities undergo variations over time that are relatively slow, with respect to partial discharge signals; therefore, acquisition channels specifically dedicated to measuring said quantities are called "slow channels". In this light, it should be noted that, in the oscilloscope/computer system, the need simultaneously to acquire through more than one channel and thus to proceed with a simultaneous detection of partial discharges and of said additional quantities entails considerable disadvantages, linked to calculation times and to the complexity of the software residing on the computer.

Therefore, the oscilloscope/computer system is penalising, not only from the cost viewpoint, but also from the performance viewpoint, because of the need to transfer enormous quantities of data from the oscilloscope to the computer.

With regard to the problems deriving from the need to transfer data from the oscilloscope to the computer, the following should also be noted.

The need to transfer a large quantity of data makes the whole data measurement/acquisition process very laborious. An additional problem is that the oscilloscope/PC communication is relatively slow and the storage memory is necessarily limited (this entailing a disadvantageous increase in dead time, i.e. of the time between the detection of one signal and the detection of the next signal), with the consequence that the oscilloscope/PC system is in distress when it has to measure in significant manner slow phenomena superposed to fast phenomena (i.e. signals with high repetition rates which are acquired simultaneously with signals with relatively low repetition rate). In practice, when it is necessary to measure a slow phenomenon (e.g., partial discharges that occur occasionally) simultaneously with a fast phenomenon (e.g. impulsive noise), the oscilloscope/PC allows only the two technical solutions that follow.

Measurement of a predetermined maximum number of signals (the maximum number allowed by the oscilloscope); in this way (in the best case), the slow phenomenon is also acquired, but there is the disadvantage of having to store an enormous quantity of data, with consequent slowing of all data measurement, transmission and, subsequently, processing operations.

Detection of a number of signals limited to a predetermined value; in this case, it is partially possible to speed up the process of measuring and subsequently processing the data, but there is the disadvantage of rapidly saturating the memory, with the risk of not acquiring the slow phenomenon in significant fashion.

Therefore, the oscilloscope/computer system does not allow to measure different signals having mutually different time dynamics in efficient, optimised fashion, for the purposes of a diagnostic evaluation of an electrical system by analysing partial discharge signals.

SUMMARY OF THE INVENTION

An object of the present invention is to eliminate the aforesaid drawbacks and to make available an instrument for measuring pulses of partial electrical discharges that enables to maximise the information content of the measured signals, in a particularly rapid and effective manner (minimising dead time).

Another object of the present invention is to minimise noise interference and to separate the effects due to different sources when the various measured pulses have mutually different shape.

Another object of the present invention is to make available an instrument for measuring pulses of partial electrical discharges able to be used without any external intervention/supervision by an operator.

Another object of the present invention is to make available an instrument for measuring pulses of partial electrical discharges that is efficient and economical.

Said objects are fully achieved by the instrument of the present invention, which is characterised by the content of the claims set out below and in particular in that it comprises data processing means operatively associated both to the input stage and to the output stage to receive said digital representation of the entire wave form of said one or more pulses, to extract the value of predetermined parameters relating to the wave form of said one or more pulses and to transfer to the output stage a processed digital signal comprising said values, the processing means being able to operate substantially in real time, i.e. with no need for an intermediate data storage memory.

Another object of the present invention is to make available a method for measuring partial electrical discharges in an electrical system, which enables to maximise the information content of the measured signals and which, at the same time, can be implemented in simple, effective fashion, also in a totally automatic manner.

Said object is fully achieved by the method of the present invention, which is characterised by the content of the claims set out below and in particular in that it comprises the following steps:
  receiving in an input stage an analogue signal representing one or more pulses of partial discharges to be measured and to generate at its output a digital representation of the entire wave form of said one or more pulses,
  processing in real time, i.e. with no need to store data in a memory, of said digital representation of the entire wave form of said one or more pulses, to extract the value of predetermined parameters relating to the wave form of said one or more pulses.

With regard to the expressions "in real time" and "storage memory", the following is specified.

The expression "real-time processing of a data item" means that, within the scope of a data stream (e.g. from an input to an output), a data item is processed without said processing entailing substantially an interruption of the data stream. For example, placing the data item in a memory (potentially for an indefinite time), to be able to retrieve it at any time and process it, constitutes an interruption of the data stream, hence a storage. Storage memory means a memory able to (or, from the hardware viewpoint, a memory managed in such a way as to) contain a data item for a potentially unspecified time, to be able to retrieve it subsequently (at any time) and process it. In this light, it should be noted that a mass storage memory, e.g. the hard disk of a computer, is typically a storage memory, whilst a RAM memory can, depending on how it is managed, constitute a storage memory (as clarified above), or, alternatively, it can constitute a buffer (temporary memory), i.e. a means that enables to slow down the data stream (at a certain point of the path travelled by the data from the input to the output), but without interrupting it. Therefore, real time processing means that the processing takes place during the passage of data from an input to an output in a substantially continuous stream, which may entail a slowing of the data stream, through a temporary accumulation of the data in a substantially volatile memory, but may not entail an interruption of the stream.

BRIEF DESCRIPTION OF DRAWINGS

This and other characteristics shall become more readily apparent from the following description of a preferred embodiment, illustrated purely by way of non limiting example in the accompanying drawing tables, in which.

Figure 1:
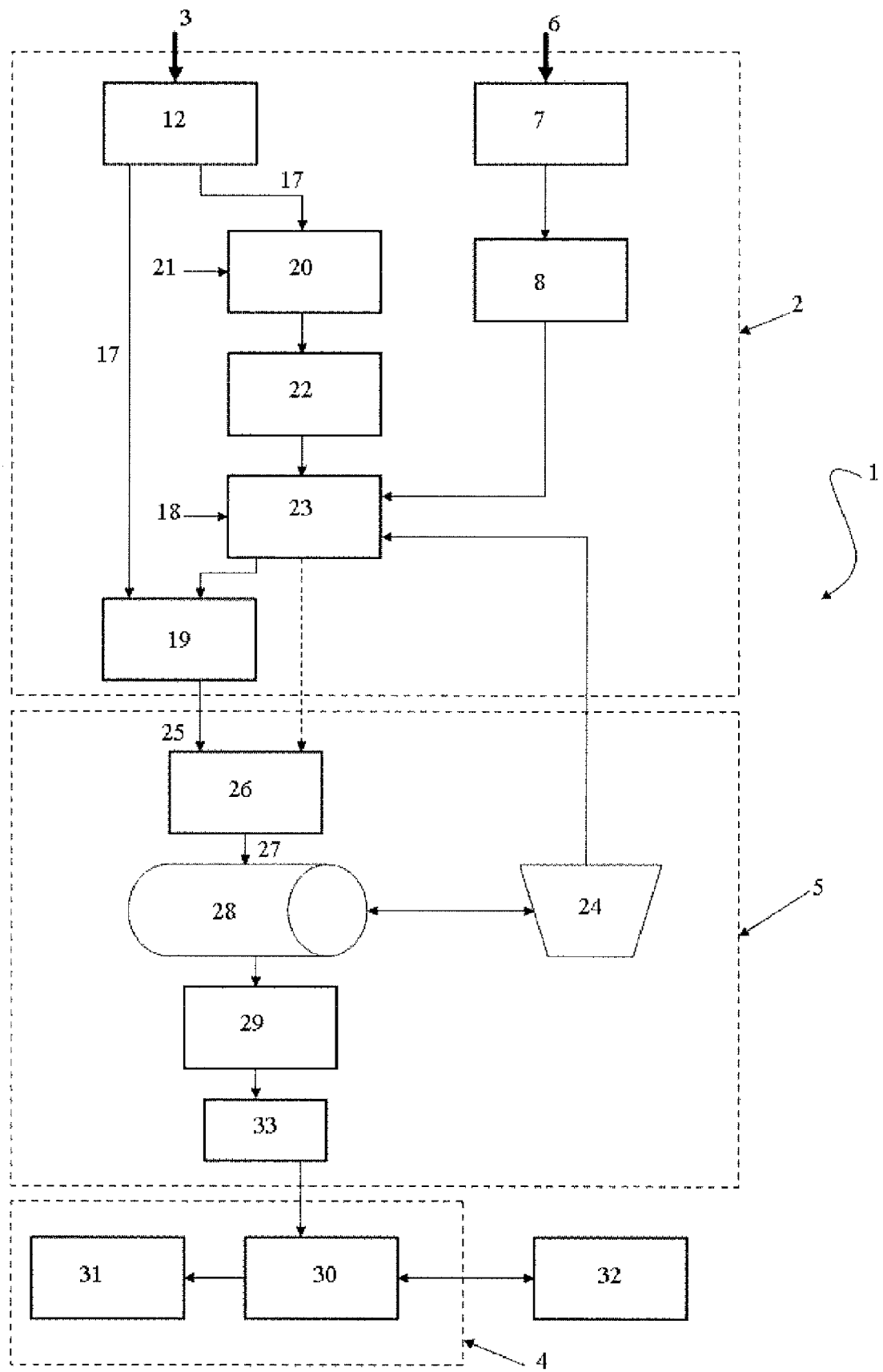
FIG. 1 schematically shows an instrument according to the present invention.

A series of definitions are provided below, preliminarily to the detailed description of the invention. Said definitions shall be used in the subsequent description, both to clarify general concepts, and to specify technical characteristics of specific elements of the invention.

Equivalent duration (T): the standard deviation of the partial discharge pulse evaluated in the time domain.

Equivalent bandwidth (W): the standard deviation of the partial discharge pulse evaluated in the frequency domain.

Coupler: a device able to draw a discharge signal from the examined system; e.g., a high voltage capacitor connected in series to a resistor: the capacitor blocks high voltage at 50/60 Hz and allows the passage of the discharge signal, the discharge signal is measured as the voltage drop over the resistor.

Anti-aliasing filter: a filter used in sampled data systems to convert the signal from analogue to digital in a correct manner. It is well known that if the analogue signal contains components whose frequency exceeds half the sampling frequency, a distortion known as aliasing can occur. Therefore, the anti-aliasing filter is a low-pass filter that removes the possible components of the analogue signal whose frequency exceeds half the sampling frequency.

Segment: sequence of samples representing the profile over time (wave form) of the individual event to be measured (discharge pulse). Each segment comprises the number of samples (time duration) that form the pulse and the number of pre-trigger samples (pre-trigger time).

Minimum Peak Dead Time: minimum time interval between the end of the acquisition of a segment and the moment when the subsequent segment can be acquired. It depends on the speed of the part of the system between an input stage and a first buffer available for the segments or other extracted predetermined parameters.

Minimum Continuous Dead Time: time interval between the end of the acquisition of a segment and the moment when the subsequent segment can be acquired, measured in the stationary condition of continuously acquired segments. It depends on the speed of the entire system and of the recipient of the segments or of the parameters extracted thereby.

Maximum Segment Burst Length (MSBL): maximum number of segments the system is able to acquire assuring the minimum peak dead time before it is no longer possible to comply with it (continuing to acquire, the dead time increases until reaching the Minimum Continuous Dead Time).

BEST MODE FOR CARRYING OUT THE INVENTION

In the figures, the numeral 1 designates an instrument for detecting partial electrical discharges in an electrical system. The instrument 1 is operatively connected to the electrical system under evaluation through a measurement circuit comprising at least a coupler, according to the prior art in the sector of partial electrical discharge measurements.

The instrument 1 comprises an input stage 2, set up to receive an analogue discharge signal 3, i.e. an analogue signal representing one or more pulses of partial discharges to be measured, and (set up) to generate at its output a digital representation of the entire wave form of said one or more pulses. Moreover, the instrument 1 comprises an output stage 4, set up to transfer data in digital form at the output from the instrument.

The instrument 1 also comprises, originally, data processing means 5 operatively associated both with the input stage 2 and with the output stage 4 to receive said digital representation of the entire wave form of said one or more pulses, extract the value of predetermined parameters relating to the wave form of said one or more pulses and transfer to the output stage 4 a processed digital signal comprising said values. The processing means 5, originally, are able to operate substantially in real time, i.e. with no need for a memory for the intermediate storage of the data.

With reference to FIG. 1 (and to FIG. 2), the numeral 6 designates an analogue synchronism signal, representing a voltage applied to the electrical system. As is well to known, said synchronism signal 6 is not essential for measuring partial discharge (PD) signals, but it is useful in a subsequent step of evaluating the measured data for diagnostic purposes, in the case of electrical systems operating in alternating current. A combined measurement of the PD signals and of the synchronism signal enables to obtain a correlation between each partial discharge event with the value that the voltage applied to the electrical system had in the instant when the event took place (it should be noted that to said correlation are associated parameters called "phase parameters").

The instrument 1 is provided with a stage for measuring said analogue synchronism signal 6, originally comprising, in a preferred embodiment (the one illustrated), a block 7 for digitising said analogue signal, connected to a block 8 for generating a base of synchronism times. Operatively, said block 8 for generating a base of synchronism times derives from the samples coming from the digitising block 7 the time elapsed since the last passage of the synchronisation signal through zero. This time is saved together with every segment to obtain, relating it to the period of the synchronism signal, the phase parameters. Said block 8 is implemented, in the preferred embodiment, in hardware mode, in programmable logic, but it can also be implemented via software.

It is specified that, with regard specifically to the present invention, every reference made to "software" means a set of programming instructions residing in a storage memory within the apparatus, otherwise known as firmware.

It should be noted that the stage of measuring the synchronism signal 6 is a part, from the logical-functional viewpoint, of the input stage 2.

Figure 4:
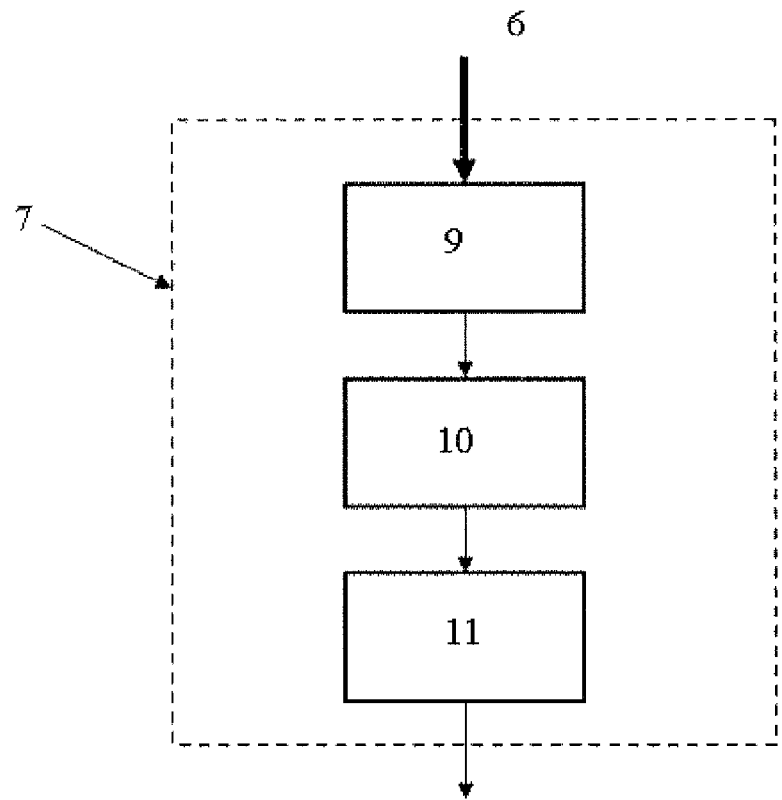
FIG. 4 schematically shows an additional detail of the instrument of FIG. 1.

The block 7 for digitising the analogue synchronism signal 6 is shown in detail (in schematic form) in FIG. 4. In particular, the block 7 comprises:
 an overvoltage (ESD) protection element 9, of a substantially known kind, able to prevent overvoltages or electrical discharges from damaging the subsequent stages of the instrument;
 a low-pass analogue filter 10;
 an analogue/digital converter 11.

The fact that the instrument 1 samples the synchronism signal 6 (unlike prior art solutions, which use a simple analogue comparator for the detection of the passage through zero) has the following advantages:
 it is possible to check (also by means of graphic representations) the wave form of the synchronism signal 6 and to conduct measurements and processing operations on said signal;
 the synchronisation logic can be varied at will to accommodate particular signals (e.g. OWTS, or cases in which the applied voltage has damped oscillations) without changing the hardware.

The instrument 1 also comprises a block 12 for digitising the discharge signal 3, i.e. the analogue signal correlated to the partial discharges taking place in the electrical system.

Figure 3:
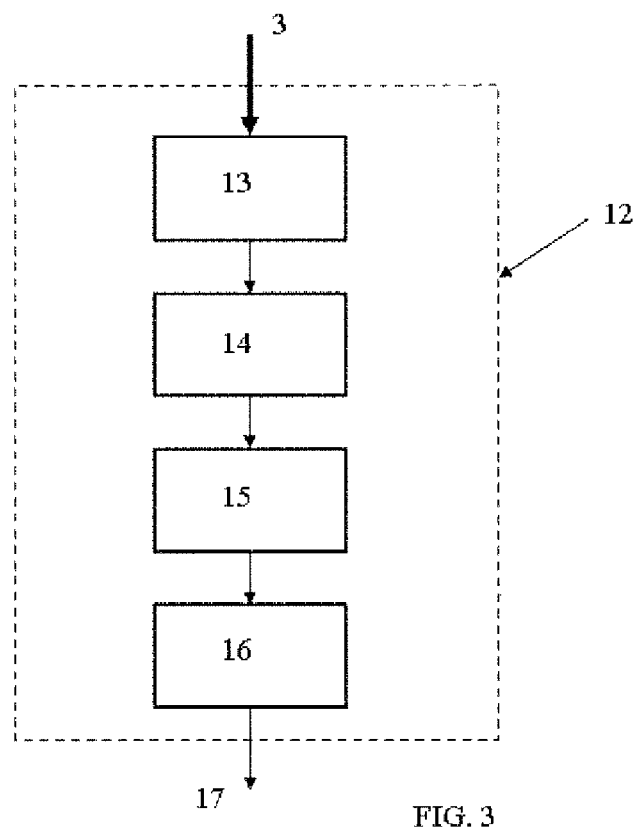
FIG. 3 schematically shows a detail of the instrument of FIG. 1.

The block 12 for digitising the discharge signal 3, illustrated (schematically) in detail in FIG. 3, in turn comprises:
 an overvoltage protection element 13, of a substantially known kind, able to prevent overvoltages or electrical discharges from damaging the subsequent stages of the instrument;
 an analogue gain control stage 14 (of a substantially known kind);
 a known anti-aliasing 15;
 an analogue/digital converter 16 (of a known kind).

The gain control stage 14 is able to adapt the amplitude of the input signal 3 to the interval of voltages allowed by the analogue/digital converter 16, in such a way as to maximise its dynamics and to prevent saturation phenomena (saturation takes place when the input signal to said converter exceeds the maximum or minimum level of voltage it is able to sample).

It should be noted that the digitisation block 12 is able to operate, in wide band, to receive at its input the analogue discharge signal 3, outputting a digital signal constituted by a continuous sequence of samples 17. It should be noted that the digitisation block 12 preferably operates at a constant sampling rate (e.g. 100 MS/s). The instrument 1 is also provided with a plurality of acquisition parameters 18, configurable from the outside, necessary for processing the samples 17. Said acquisition parameters 18 are stored in the instrument 1. Said acquisition parameters comprise, in particular:
 acquisition time: defined by the number of samples constituting a segment, i.e. a digital signal representing the profile over time (wave form) of a single partial electrical discharge;
 pre-trigger time: defined by the number of samples preceding a trigger event;
 minimum dead time: minimum time that must elapse between the end of the acquisition of a segment and enabling the trigger for the acquisition of the subsequent segment.

The digitisation block 12 is connected both to a pre-trigger deposit 19 and to a trigger generator 20.

The pre-trigger 19 deposit is constituted by a circular buffer, that maintains a number samples equal to the pre-trigger time for the formation of a subsequent segment; it is preferably implemented via hardware in programmable logic.

The trigger generator 20 originally comprises a double threshold comparator (unlike known trigger generators that comprise a single threshold comparator), receiving as an input a predetermined reference value for a trigger threshold 21. It should be noted that any strategy for the activation of the trigger can be implement in the generator 20.

Therefore, the pre-trigger 19 and the trigger generator 20 receive as an input the signal comprising the samplers 17, output by the digitisation block 12.

The trigger generator 20 is connected to a trigger selector 22 (of a substantially known type), which in turn is connected to a block 23 for managing the input stage 2.

The management block 23 receives at its input:
the digital signal output by the trigger selector 22;
the digital signal output by the block 8 for generating a base of synchronism times;
said acquisition parameters 18;
a control signal coming from a control element 24, which will be described below.

The management block 23 is connected in output to the pre-trigger deposit 19, to operate a management thereof; in practice, the management block 23 recognises and selects, within the uninterrupted stream of the samples 17, segments 25 representing the profile over time (wave form) of the partial discharge signals.

Therefore, the segments 25 are selected by the management block 23, at the output from the pre-trigger deposit 19.

The processing means 5 originally comprise a block 26 for processing/extracting predetermined parameters, relating to the wave form of said one or more PD pulses.

The block 26 is preferably implemented in logic programmable via hardware (but it can also be implemented via software) and receives the segments 25 at its input. The block 26 operates in real time and it has the function of extracting from the samples of a segment 25 the predetermined parameter values. In particular, said predetermined parameters comprise, for each partial discharge pulse: equivalent duration (T), equivalent bandwidth (W), polarity (i.e. the sign of a first peak of the pulse exceeding, in absolute value, a reference value), amplitude of the pulse, energy of the pulse, together with other quantities obtained by applying various signal processing techniques, such as wavelets. It should be noted that said parameters equivalent duration (T) and equivalent bandwidth (W) can be replaced with other parameters similar to them, or they can be calculated in alternative manners with respect to the definitions provided above (which anyway constitute a preferred way to calculate said parameters).

In general, the extracted parameters contain all the information about the measured PD pulses, linked particularly (but not exclusively) to the wave form of the pulses, useful for a subsequent use of the measured data for diagnostic purposes.

In this light, it should be noted that the instrument 1 acquires and makes available at its output data pertaining to the partial discharge pulses taking place in the electrical system in question; said data will then be used to conduct a diagnostic evaluation of the electrical system and/or to be stored, to constitute a knowledge base for the development of diagnostic strategies. In any case, the data about the partial discharge pulses are to be manipulated, processed, displayed, etc. according to requirements and procedures that, in principle, may not be known or foreseeable ahead of time. Therefore, it is important that the data measured by the instrument 1 be as significant and complete as possible.

Thus, the block 26 receives at its input the segments 25 (i.e. a digital representation of the entire profile over time of the PD pulses), processes them in real time and outputs a compacted digital signal 27, constituted by a representation that is synthetic (hence manageable with particularly short calculation time) but is equally representative of the entire profile over time of the PD pulses.

The action of the block 26 entails that the segments 25 in themselves are not maintained, with consequent advantage in terms of the quantity of data processed/outputted by the instrument. However, it should be noted that the instrument 1 also provides the possibility of bypassing the block 26, by means of an inhibiting signal sent by the management block 23, so that the segments 25 are outputted by the block 26 without any processing/extraction.

The fundamental characteristic of said compacted digital signal 27 is that it requires much less space (RAM) to be stored than do the samples of the segments 25, thereby contributing to expand Maximum Segment Burst Length (for equal RAM).

In the preferred embodiment illustrated, the processing/extraction block 26 is connected to a buffer 28, i.e. a circular memory, able to store in real time (at the same rate whereat it receives the input data) the compacted digital signal 27 (or the segments 25, if the extraction block 26 is inhibited) to make them available to subsequent stages, which may be operating at different rates. The buffer 28 is preferably implemented with logic programmable via hardware (but it can also be implemented via software).

The buffer 28 interacts with the control element 24, whose function is to determine whether or not to allow the acquisition of a new segment according to the amount of free space in the buffer 28. The control element 24 is preferably implemented with logic programmable via hardware (but it can also be implemented via software).

The buffer 28 is connected with a second processing/extraction block 29, preferably implemented via software (e.g. comprising a DSP, or a microprocessor or a micro-controller or a combination thereof), but also programmable via hardware with programmable logic. The function of the second processing/extraction block 29 is similar to that of the processing/extraction block 26; the processing/extraction block 29, operating downstream of the buffer 28, can perform calculations that require more time, without slowing the operation of the instrument 1. The fact that the processing means 5 originally comprise two distinct processing/extraction blocks 26 and 29 and a buffer 28 interposed between the blocks themselves allows to optimise calculation times and to minimise the Dead Time, while operating in real time, i.e. with no need for a memory in which to store a certain quantity of data, to extract it subsequently. Moreover, in the combined action of the two blocks 26 and 29, the processing/extraction block 26 reduce the quantity of work of the second processing/extraction block 29 and hence reduces Continuous Minimum Dead Time.

It should be noted the processing means 5 may also comprise a single processing/extraction block 26, operating in real time, with no need to interpose the buffer 28.

It should be noted that the processing means 5 may also comprise further architectures.

Two aspects should be specified, with regard to the operation of the processing block and to the management of the data stream.

The pre-trigger deposit 19 and the buffer 28 constitute memories (whose presence is not indispensable for the purposes of the present invention) that are preferably organised as circular, managed according to a FIFO logic; i.e., said memories input and output data in the same order in which they are received, continuously, without interruptions to the data stream. Therefore, the function of the memory is to operate a temporary slow-down of the data stream. In other words, the buffer 28 constitutes means for (temporarily) slowing the data stream from said input stage to said output stage.

The processing blocks 26 and 29 are able to derive parameters on the basis of the entire wave form of the partial discharge pulse. However, the processing block 26 (and possibly the second processing block 29) does not operate simultaneously on all samples corresponding to a pulse, but on one sample at a time (sequentially), performing a sequence of passages (in the calculation of said predetermined parameters) and retaining at each passage a partial result in its own register, said partial result being updated from time to time, until it assumes the definitive value for said predetermined parameter, after the last sample relating to the pulse has been processed. This implementation aspect contributes to the possibility of deriving in real time (with particularly reduced dead time values) parameters based on the entire wave form of the measured partial discharge pulses.

It should be noted that, in the data stream from the input stage 2 to the output stage 4, the sequence of events is from the input to the output, according to the "push system".

The output stage 4 of the instrument 1 comprises a communication interface 30, able to encapsulate the data from and to the instrument 1 on a two-directional communication bus 31, preferably stream-oriented.

It should be noted that the term two-directional communication oriented to the stream between A and B means any system that allows to transfer two data streams, one from A to B, the other one from B to A, such that the data reach the recipient in the same order with which they were sent and that the two streams are substantially simultaneous and continuous. The physical implementation can bear on non continuous (packet) systems and/or non simultaneous systems (half-duplex) and/or non ordered systems, but in this case too it is possible to continue to speak of data streams, because appropriate protocols and/or buffers can return the communication to conditions of continuity, simultaneity and order.

It should be noted that Minimum Continuous Dead Time can depend on the transfer capacity of the bus 31 if it is lower than that of the processing/extraction block 29. Said bus 31 can comprise, for example, known technical solutions such as RS232, USB, firewire, or Ethernet. The communication interface 30 can be implemented both via hardware and via software. The preferred embodiment of the invention provides for a TCP/IP socket implementation on Ethernet through a hardware device. The instrument 1 also comprises a control logic 32, overseeing all control and synchronisation functions of the software components of the instrument 1, implemented via software.

Moreover, the processing means 5 preferably comprise, originally, a conditioning element 33, inserted between the second processing/extraction block 29 (or the processing/extraction block 26) and the output stage 4, to operate a digital filtering of the processed signal, as a function of the derived values.

Said conditioning element 33, operating a real time filtering of the measured signal according to said predetermined parameters (correlated to diagnostic evaluations of the electrical system based on the evaluation of the activity of the partial discharges), allows an important advantage, i.e. that of being able to observe a slow phenomenon (characterised by few discharge pulses in the unit of time) for a long time without saturating a memory (possibly connected to the output stage 4, downstream of the instrument 1) with the data relating to another, very intense, concomitant phenomenon (characterised by a relatively high number of discharge pulses or of unwanted signals in the unit of time).

It should be noted that the extraction element 33 advantageously allows to reject noise or to select pulses belonging to a given discharge phenomenon with respect to other superposed pulses, in real time, on the basis of the wave form of the signals. This enables the instrument 1 to output complete, significant data, with no risk of information loss. Otherwise, if the coarse input analogue signal were measured and digitised (without processing or filtering) and stored in a memory, to carry out all processing operations at subsequent times (e.g. through a computer), there would be the risk of not being able to measure all pulses of interest, given the quantity of information that would have to be managed via software.

Figure 2:
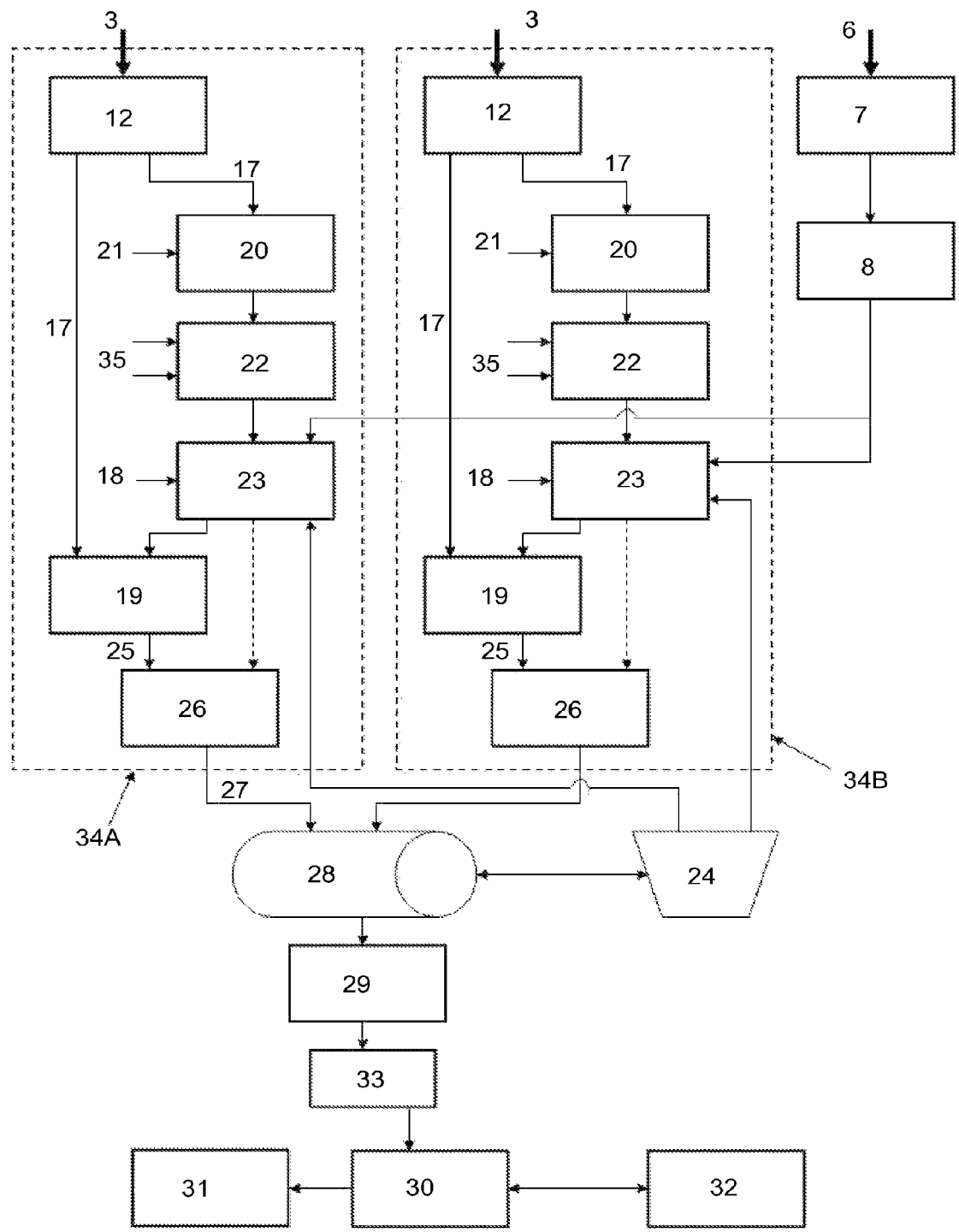
FIG. 2 shows the instrument of FIG. 1 according to an embodiment variant.

With reference to FIG. 2, the digitisation block 12, the pre-trigger deposit 19, the trigger generator 20, the trigger selector 22, the management block 23, the processing/extraction block 26 (and possibly the buffer 28 and the second processing/extraction block 29) define a unit, from the logic-functional viewpoint, whereto reference shall be made below as acquisition channels 34A and 34B. In the embodiment illustrated in FIG. 2, the instrument 1 comprises a first acquisition channel 34A and a second acquisition channel 34B. In the presence of two or more acquisition channels, each trigger selector 22 receives and sends control signals 35, interacting with other trigger selectors 22 included in corresponding acquisition channels 34A and 34B.

It should be noted that it is provided for the instrument 1 to have a plurality of acquisition channels 34A and 34B. Said acquisition channels 34A and 34B can be dedicated, for example, to the measurement of partial discharges taking place on different phases of a multi-phase electrical system. The use is also provided of one or more acquisition channels 34A and 34B to measure quantities other than partial discharges, e.g. quantities correlated to environmental factors (e.g. temperature and humidity); in this case, the instrument 1 originally comprises channels dedicated to the detection of PD and slow channels, substantially active in parallel. Note that said channels do not necessarily require the presence of trigger means.

In case of plurality of acquisition channels 34A and 34B, there are many possible architectures: from the complete separation of the processing means 5, to partial sharing, to complete sharing; complete sharing makes simultaneous acquisitions impossible without the presence of a memory area to contain the samples simultaneously.

The present invention also makes available a method for measuring partial electrical discharges in an electrical system.

Said method comprises the following steps:
receiving in an input stage an analogue signal representing one or more pulses of partial discharges to be measured and subsequently generating a digital representation of the entire wave form of said one or more pulses,
processing in real time, i.e. with no need to store data in a memory, said digital representation of the entire wave form of said one or more pulses, to extract the value of predetermined parameters relating to the wave form of said one or more pulses. Said method also comprises a step of measuring an analogue synchronism signal, representing a voltage applied to the electrical system, made available for the processing step. In particular, a step of digitising said analogue synchronism signal is originally provided.

Also provided is a step of conditioning/filtering the processed digital signal, subsequent to the processing step, as a function of the derived values.

The processing step preferably comprises, in turn, the following sub-steps:
first processing of said digital representation of the entire wave form of said one or more pulses,
temporarily writing data in digital form in a buffer;
second processing of data read from the buffer.

Operatively, the method according to the present invention comprises the following In an input stage 2, an analogue signal 3 representing one or more PD pulses is translated, through a sampling step, into a continuous stream of samples representing the wide band signal to be analysed; the samples are transferred to a trigger generator 20, which observes the signal searching for samples that exceed the set threshold (trigger threshold 21) and generates the trigger event, and a pre-trigger deposit 19, a circular buffer that stores a number of samples equal to the pre-trigger time. In practice, the pre-trigger deposit 19 presents at the input of a processing/extraction block 26, or directly to a buffer 28, a flow of samples identical to the one it receives, but delayed by a time equal to the pre-trigger time. At the trigger event, a management block 23, if there is space in the buffer 28, activates the processing/extraction block 26 and, after a time set according to the acquisition parameters 18, it determines the end of a segment 25; the processing/extraction block 26 analyses said flow and extracts predetermined parameters from the segment, which are saved on the buffer 28.

If the processing/extraction block 26 is inhibited (by the management block 23), the management block 23 orders the storage on the buffer 28 of the entire segment 25 together with its time co-ordinates (absolute time and time relative to the synchronism signal). It should be noted that said time co-ordinates are saved (by the processing/extraction block 26 itself) also if the block 26 is not inhibited.

The present invention makes available an apparatus and a method that allow the following advantages.

The present invention enables to measure partial discharge pulses with a particularly short Dead Time. It should be noted that a Dead Time (which is substantially the time in which the system is blind after acquiring a segment, before being able to acquire another one) with limited value allows in the first place to acquire a higher number of PD phenomena at the same time. In this light, it should be noted that, if PD phenomena are immersed in noise (e.g. non continuous noise, such as interference between electrical apparatuses), an acquisition system known in the art does not allow to separate the PD phenomena from each other and/or from noise. Hence, the possibility of acquiring a great number of data, with no need to store said data in a memory, enables to measure and separate the PD phenomena from each other and from noise in real time or also at a subsequent time, by analysing predetermined parameters extracted in real time. Note that said separation can be accomplished within the instrument 1 before the data are outputted, saving on the bandwidth of the communication bus.

Separating the processing/extraction block in two blocks, 26 and 29, enables to limit dead time to very small values (at least for a certain number of discharges), e.g. below 1 µs.

The sense of having a particularly short Dead Time for a certain number of discharges derives from the fact that PD phenomena are typically not distributed uniformly over time, but concentrate in determined time intervals. In this light, the present invention enables to absorb discharge concentrations without losing them, and then process them when the discharge rate is more limited.

Note that the instrument 1 integrates in programmable logic everything that works in real time, including the buffer 28, while a remaining part of the calculations is performed by elements implemented via software, or by a DSP, so that the instrument 1 is able to perform substantially any type of calculation, whilst limiting the costs. The programmable logic can quickly perform relatively simple operations, whilst the software in DSP can perform any kind of calculation, but typically in a longer time, depending on its cost and on its complexity. The division of tasks between the two components enables to obtain excellent performance levels whilst limiting costs and complexity.

Note also that the components implemented in programmable logic and those implemented via software (DSP) always operate simultaneously, because the buffer 28 can be written by the programmable logic (e.g. the processing/extraction block 26) and, simultaneously, read by DSP (e.g. the second processing/extraction block 29); the programmable logic has to stop only when the buffer 28 is full.

Note also that an advantage of the present invention is constituted by the possibility of performing highly complex processing operations on the measured data, in particularly quick and efficient fashion, thanks to the fact that said advanced processing operations (i.e. processing operations that, in themselves, require great expenditure of calculation resources) are performed downstream of the intervention of the processing/extraction block 26, i.e. on the compacted digital signal 27 in real time. Therefore, the present invention allows to provide a diagnostic evaluation of the evaluated electrical system (e.g. by applying artificial intelligence techniques or any other processing technique applicable substantially in real time to the measured data) substantially in real time.

Moreover, it should be noted that the present invention enables to measure and process, in simultaneous and synergetic fashion, signals pertaining to partial discharge pulses and signals pertaining to any other quantity, thanks to the possibility of using a plurality of mutually interacting acquisition channels 34A and 34B.

Note also that the present invention requires no supervision on an operator's part; therefore, it can be used under any condition, also for monitoring purposes (i.e. for the continuous measurement, extending over an indefinite time, of the discharge signals taking place in the electrical system in question).

LIST OF FEATURES REFERENCED IN THE DRAWINGS 1) instrument
2) input stage
3) discharge signal
4) output stage
5) processing means
6) synchronism signal
7) block for digitising said analogue signal
8) block for generating a base of synchronism times
9) overvoltage protection element (ESD)
10) low-pass analogue filter 10
11) analogue/digital converter
12) block for digitising the discharge signal
13) protection element
14) analogue gain control stage 15) anti-aliasing filter
16) analogue/digital converter
17) continuous sequence of samples
18) acquisition parameters
19) pre-trigger deposit
20) trigger generator
21) trigger threshold
22) trigger selector
23) management block
24) control element
25) segments
26) block for processing/extracting
27) compacted digital signal
28) buffer
29) second processing/extraction block
30) communication interface
31) communication bus
32) control logic
33) conditioning element
34A, 34B) acquisition channels
35) control signals

The invention claimed is:

1. An instrument (1) for measuring partial electrical discharges in an electrical system, comprising:
an input stage (2) set up to receive an analogue signal (3) representing one or more pulses of partial discharges to be measured and to generate at its output a digital representation of the entire wave form of said one or more pulses,
an output stage (4) set up to transfer data in digital shape at the output from the instrument,
data processing means (5) operatively associated both with the input stage (2) and with the output stage (4) to receive said digital representation of the entire wave form of said one or more pulses, extract the value of predetermined parameters relating to the wave form of said one or more pulses and transfer to the output stage (4) a processed digital signal comprising said values, the processing means (5) operating substantially in real time,
characterized in that said predetermined parameters comprise amplitude of the discharge pulses, phase parameters, equivalent duration (T) and equivalent bandwidth (W).

2. An instrument as claimed in claim 1, wherein said input stage (2) is able to operate with bandwidth exceeding about 20 MHz.

3. An instrument as claimed in claim 1, wherein the processing means (5) comprise a conditioning element (33), inserted upstream of the output stage (4), to operate a digital filtering of the processed signal, as a function of the derived values.

4. An instrument as claimed in claim 1, wherein is present a plurality of acquisition channels (34A, 34B) and possibly a plurality of corresponding processing means (5), operatively connected, substantially in parallel to each other, to the output stage (4).

5. An instrument as claimed in claim 1, comprising a buffer (28), inserted between the input stage (2) and the output stage (4), for temporarily writing data in digital form.

6. An instrument as claimed in claim 1, wherein said predetermined parameters comprise the polarity of each partial discharge pulse, said polarity being defined by the sign of a first peak of the pulse exceeding, in absolute value, a reference value.

7. An instrument as claimed in claim 1, wherein the output stage comprises a two-direction communication bus (31), which may be stream-oriented.

8. An instrument as claimed in claim 1, wherein is present a stage (7, 8) for measuring an analogue synchronism signal (6), representing a voltage applied to the electrical system, operatively connected to the processing means.

9. An instrument as claimed in claim 8, wherein are present means for digitising said analogue synchronism signal.

10. An instrument as claimed in claim 1, wherein the processing means (5) comprise a block (26) for processing/extracting said predetermined parameters from said digital representation.

11. An instrument as claimed in claim 10, wherein the processing means (5) comprise a buffer (28), inserted downstream of the processing/extraction block (26).

12. An instrument as claimed in claim 10, wherein the processing means (5) comprise a second processing/extraction block (29) and a buffer (28), inserted between said processing/extraction blocks.

13. A method for measuring partial electrical discharges in an electrical system, characterised in that it comprises the following steps:
receiving in an input stage (2) an analogue signal (3) representing one or more pulses of partial discharges to be measured and to generate at its output a digital representation of the entire wave form of said one or more pulses,
processing in real time said digital representation of the entire wave form of said one or more pulses, to extract the value of pre-set parameters relating to the wave form of said one or more pulses, said parameters comprising amplitude of the discharge pulses, phase parameters, equivalent duration (T) and equivalent bandwidth (W).

14. A method as claimed in claim 13, comprising a step of conditioning/filtering the processed digital signal, subsequent to the processing step, as a function of the derived values.

15. Method as claimed in claim 13, wherein the processing step in turn comprises the following sub-steps:
first processing of said digital representation of the entire wave form of said one or more pulses,
temporarily writing data in digital form in a buffer (28);
second processing of data read from the buffer (28).

16. A method as claimed in claim 13, comprising a step of measuring an analogue synchronism signal (6), representing a voltage applied to the electrical system, made available for the processing step.

17. Method as claimed in claim 16, comprising a step of digitising said analogue synchronism signal (6).

18. A diagnostic apparatus for electrical systems/components, comprising:
an instrument for measuring partial electrical discharges;
means for processing/evaluating, for diagnostic purposes, quantities derived from the measured partial discharges and possibly other quantities,
wherein said instrument is an instrument for measuring partial electrical discharges in an electrical system, comprising:
an input stage (2) set up to receive an analogue signal (3) representing one or more pulses of partial discharges to be measured and to generate at its output a digital representation of the entire wave form of said one or more pulses,
an output stage (4) set up to transfer data in digital shape at the output from the instrument,
data processing means (5) operatively associated both with the input stage (2) and with the output stage (4) to receive said digital representation of the entire wave form of said one or more pulses, extract the value of predetermined parameters relating to the wave form of said one or more pulses and transfer to the output stage (4) a processed digital signal comprising said values, the processing means (5) operating substantially in real time,
characterized in that said predetermined parameters comprise amplitude of the discharge pulses, phase parameters, equivalent duration (T) and equivalent bandwidth (W);
or wherein said instrument operates according to a method for measuring partial electrical discharges in an electrical system, characterised in that it comprises the following steps:
receiving in an input stage (2) an analogue signal (3) representing one or more pulses of partial discharges to be measured and to generate at its output a digital representation of the entire wave form of said one or more pulses,
processing in real time said digital representation of the entire wave form of said one or more pulses, to extract the value of pre-set parameters relating to the wave form of said one or more pulses, said parameters comprising amplitude of the discharge pulses, phase parameters, equivalent duration (T) and equivalent bandwidth (W).

* * * * *